United States Patent [19]

MacLellan et al.

[11] Patent Number: 5,043,760

[45] Date of Patent: Aug. 27, 1991

[54] CARRIER PARTICLE LOOSENING DEVICE

[75] Inventors: Bruce D. MacLellan, Ontario; Robert H. Shea, Victor, both of N.Y.

[73] Assignee: Eastman Kodak Company, Rochester, N.Y.

[21] Appl. No.: 506,308

[22] Filed: Apr. 9, 1990

[51] Int. Cl.[5] ............ G03F 21/00

[52] U.S. Cl. ............ 355/296; 355/305

[58] Field of Search ............ 355/296, 297, 305; 118/652

[56] References Cited

U.S. PATENT DOCUMENTS

| | | | |
|---|---|---|---|
| 3,993,022 | 11/1976 | Zimmer | 118/652 |
| 4,111,546 | 9/1978 | Maret | 355/297 |
| 4,571,070 | 2/1986 | Tomita | 355/305 |
| 4,601,569 | 7/1986 | Garris | 355/305 |
| 4,723,144 | 2/1988 | Silverberg | 355/251 |
| 4,851,880 | 7/1989 | Ziegelmuller et al. | 355/302 |
| 4,918,488 | 4/1990 | Creveling et al. | 355/296 |

FOREIGN PATENT DOCUMENTS

| | | | |
|---|---|---|---|
| 60-3691 | 1/1985 | Japan | 355/296 |

*Primary Examiner*—Joan H. Pendegrass

*Attorney, Agent, or Firm*—Tallam I. Nguti

[57] ABSTRACT

In an electrostatographic copier or printer utilizing developer material including magnetic carrier particles, a rotatable, multiple magnetic pole device, located on the backside of an image bearing member being cleaned by a cleaning apparatus, assists magnetic carrier particle removal by creating fast changing and pulsating magnetic fields that disembed and loosen embedded magnetic carrier particles from the image bearing member.

7 Claims, 1 Drawing Sheet

CARRIER PARTICLE LOOSENING DEVICE

BACKGROUND OF THE INVENTION

This invention relates generally to electrostatographic reproduction apparatus, and more particularly to devices for loosening and removing residual particles from an image-bearing surface of such apparatus.

Electrostatographic process reproduction apparatus for producing copies of an original document are well known. Such copies typically are produced on suitable receivers through a repeatable process that normally includes the steps of (1) using electrostatic charges in some manner to form a latent image on the surface of an image-bearing member; (2) developing the latent image with developer material that includes toner particles; (3) transferring the developed image to a suitable receiver for fusing; and (4) cleaning the image-bearing surface thereafter by removing residual toner and other particles therefrom in preparation for repeating the process.

The quality of the copies obtained by repeating these steps depends significantly on the effectiveness of cleaning devices employed for removing the residual particles left on the image-bearing surface after image transfer. Such cleaning devices include, for examples, (a) pneumatic brushes as disclosed in U.S. Pat. Nos. 4,851,880 and 4,111,546; (b) magnetic brushes as disclosed in U.S. Pat. Nos. 4,723,144 and 4,601,569; and (c) magnetic sleeves as disclosed in U.S. Pat. No. 4,571,070. Typically, these cleaning devices mechanically contact the image-bearing surface in order to contact and remove residual toner and other particles thereon. Such contact howeve must be slight so as not to disturb the smooth movement of the image-bearing member during the copying process, and so as not to scratch or otherwise damage the image-bearing surface being cleaned.

Accordingly, such apparatus ordinarily will effectively remove only residual particles that are loosely associated with the image-bearing surface, but not particles that are strongly attached to, or embedded in such surface. As disclosed in above-cited U.S. Pat. No. 4,111,546, additional mechanisms such as an ultrasonic vibrator, for example, have been suggested for loosening such strongly attached or embedded particles from the image-bearing surface during their removal by a cleaning device. Ultrasonic vibrators however are relatively expensive, and in addition run a significant risk of introducing undesirable process-disturbing vibrations in the image-bearing member.

An electrostatographic process apparatus, which has an image-bearing member with a soft surface, is particularly more susceptible to this problem of strongly attached or embedded particles. Additionally, the problem is aggravated in cases where the developer material being used comprises toner particles and small, hard magnetic carrier particles. This appears to be so because such hard carrier particles tend to have very fine sharp edges and points, and such sharp edges and points then tend to become deeply embedded in the soft surface of the image-bearing member, for example, during the image transfer step. The problem is also made worse because such embedded particles, being small, may lack the mess in order to make them responsive to pneumatic or ultrasonic attempts to loosen them from such surface.

SUMMARY OF THE INVENTION

It is therefore an object of the present invention to provide, in an electrostatographic reproduction apparatus, a simple device for effectively disembedding or loosening magnetic carrier particles embedded in the image-bearing surface of an image-bearing member thereof without undesirably disturbing or damaging such image-bearing surface.

In accordance with the present invention, a mechanism is provided for removing residual toner and magnetic carrier particles from the image bearing surface of a moving image bearing member in an electrostatographic copier or printer. The mechanism includes cleaning means for removing toner and loose magnetic carrier particles from such surface, and a magnetic carrier loosening means for disembedding or loosening magnetic carrier particles embedded in such image bearing surface. The carrier particle loosening means consists of a magnetic device which can generate fast changing magnetic fields for magnetically repelling and attracting the magnetic carrier particles, thereby disembedding and loosening such carrier particles from such surface. The carrier loosening means is located relative to the cleaning means so as to disembed or loosen such embedded particles in time for effective removal by the cleaning means.

BRIEF DESCRIPTION OF THE DRAWINGS

In the detailed description of the invention presented below, reference is made to the drawings, in which.

DETAILED DESCRIPTION OF THE INVENTION

Figure 1:
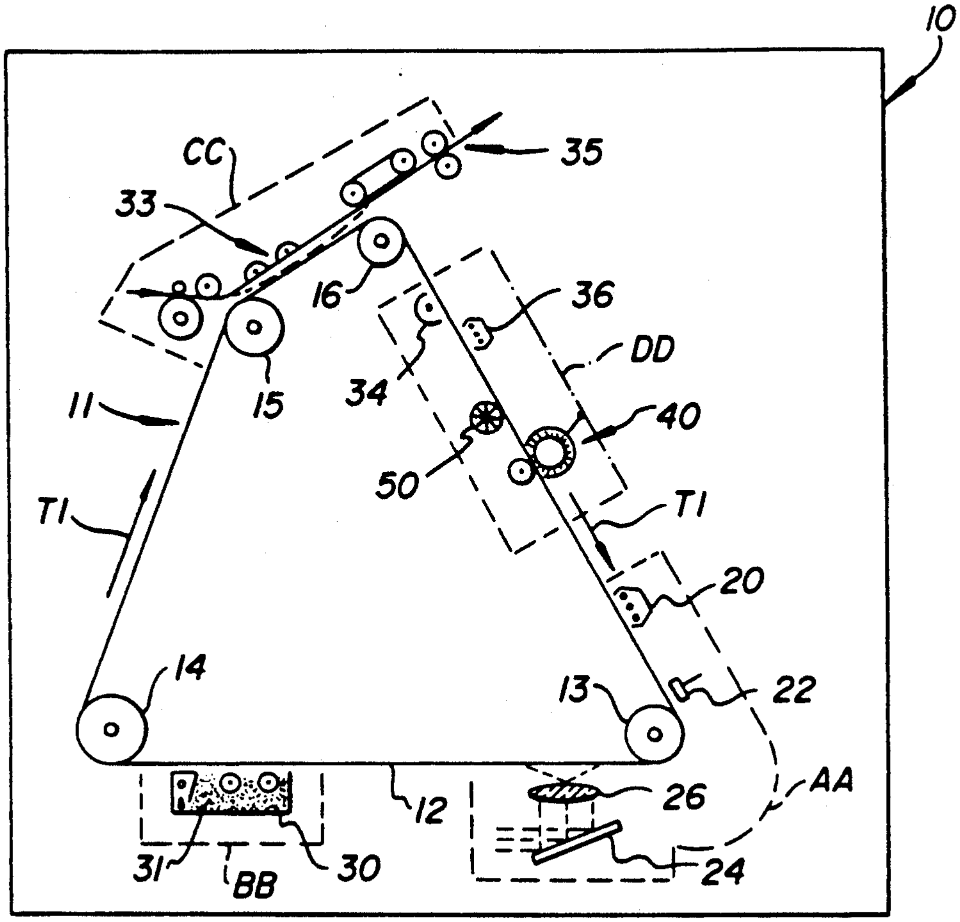
FIG. 1 is a schematic of an electrostatographic reproduction apparatus including the carrier loosening device of the present invention.

Referring now FIG. 1, an electrostatographic reproduction apparatus is shown generally as 10, and includes an image-bearing member 11 which has a soft frontside image-bearing surface 12. As shown, the member 11 is trained about a series of rollers 13 through 16 for movement in the direction, for example, of the arrow T1. One of the rollers, such as the roller 13, can be a drive roller for repeatedly moving the member 11 through a series of stages shown as AA, BB, CC and DD. Although the member 11 is shown as an endless flexible web trained about the series of rollers, it should be understood that a rigid drum, having an image-bearing surface, can also be used.

As shown in FIG. 1, clean and charge-free portions of the image-bearing member 11 for example, initially move through the state AA where electrostatic charges and/or light, are used in one manner or another (as is well known in the art) to electrostatically form latent images of an original document on the surface 12. Typically, the stage AA includes contamination sensitive components such as a primary charger 20 or other charge depositing component (not shown). The electrostatic image of an original can thus be formed on the surface 12, for example, by charging the surface 12 using the primary charger 20, and then imagewise discharging portions of such surface using an electronic printhead 22 and/or an optical system. A typical optical system has a light source (not shown) that illuminates a document sheet, with the light rays from the sheet being reflected by a mirror 24 through a lens 26 to the surface 12.

The imaged portion of the image-bearing member 11 next moves to stage BB where the latent image thereon is developed, that is made visible, with charged particles of toner.

Stage BB normally includes a development station 30 that contains a developer material 31 which may be comprised of toner particles only, or of a mixture of magnetic carrier particles and toner particles. In order to achieve high resolution development at this Stage BB, it is known to use such developer material 31 which comprise fine toner particles and a carrier consisting of small, hard magnetic ferrite particles. Each such ferrite carrier particle is of course a magnet in itself, and thus possesses distinct N and S polarities. Because of their small size, each particle additionally tends to have very fine and sharp edges and points.

During development of the image at the station 30, the toner particles of the developer material 31 transfer to the image-bearing surface 12, and there adhere to the electrostatically formed image, thereby making the image visible. Although undesirable, some of the hard magnetic carrier particles also transfer to the image-bearing surface 12, and may also adhere to the image. After such development, that portion of the image-bearing member 11 carrying the developed image, next moves to the stage CC.

Stage CC usually includes an image transfer station 33 where the visible toner image on the surface 12 is transferred to a suitable receiver such as a sheet of paper that is fed in registration to the station 33 along a sheet travel path. Typically such transfer is effected electrostatically as well as by contact and pressure within a transfer nip. It is believed that during such transfer, such contact and pressure undesirably causes some of the sharp-pointed magnetic carriers on the surface 12 to become significantly embedded in such surface. After such image transfer however, the copy sheet then travels to a fusing station 35, as shown, where the image is permanently fused to the receiver forming a copy, and the member 11 moves on about the series of rollers 13 through 16 towards the initial stage AA to begin another cycle.

Meantimes it should be understood that by the time each portion of the surface 12, on which an image has been formed and transferred as described above, leaves the transfer station 33, such portion ordinarily will be contaminated with residual charges as well as with residual particles, principally toner and magnetic carrier particles. Such residual particles, (in light of the residual charges on the surface 12) may be uncharged, negatively charged or positively charged. Accordingly they will be held, for example loosely, to the surface 12 both by adhesive forces, and by electrostatic forces. Additionally, as pointed out above, some of the hard, sharp-pointed magnetic carrier particles will be significantly embedded into the soft surface 12, and so will be strongly held thereto.

To ensure the continued production of high quality images and copies during subsequent cycles of the imaging process, it is necessary to effectively clean each used portion of the surface 12. Such cleaning therefore must effectively remove the residual charges and residual particles, including the embedded magnetic carrier particles. Accordingly, such cleaning is carried out at stage DD where mechanisms are located for removing the residual charges and particles. As shown for example, the residual charges can be removed by a discharge lamp 34 and/or neutralized by a corona 36, and the loosely held residual particles can be removed by a cleaning means or apparatus 40. The cleaning apparatus 40 may be any conventional apparatus such as a brush, a roller, a blade or a magnetic brush cleaning apparatus as are well known in the art.

The apparatus 40, for example, is shown as a pneumatic brush cleaning apparatus which includes a rotatable brush 42 having cleaning fibers 44, a housing 46, and vacuum means 48. The brush 42 is rotatable by suitable means (not shown) so that the fibers 44 contact and gently sweep the image-bearing surface 12 at a point X for removing therefrom loose particles shown as LP. The removed particles thereafter are carried by the rotating fibers, and with the aid of the vacuum means 48, away from the surface 12 for collection by suitable means (not shown). The brush 42 should preferably be rotated so that at the point X, it is moving in a direction opposite that of the surface 12. A backup roller 49 may be used on the backside of the member 11 at such point X.

As pointed out above, the apparatus 40 will effectively remove only those particles LP that are loosely held to the surface 12. Therefore, the reproduction apparatus 10 of the present invention includes means 50 for disembedding and loosening magnetic carrier particles, shown as EP, which became embedded or strongly attached to the surface 12, for example, at the image transfer station 33. As shown, the embedded particles EP must be disembedded or loosened as such prior to reaching, or at, the point X where they then can be removed effectively by the apparatus 40. Accordingly, the means 50 should be located, relative to the cleaning means or apparatus 40, so as to disembed or loosen the particles EP in time for such effective removal by such apparatus 40. For example as shown, the means 50 is located after the image-transfer means 33, but before the cleaning apparatus 40. The means 50 also could be located directly across from the apparatus 40.

As shown, the means 50 consists of a magnetic device for generating fast changing and pulsating magnetic fields about the image-bearing member 11. As shown for example, the means 50 can include a magnetic roller 52 comprising a plurality of longitudinally extending magnets M1, M2, M3 . . . , which form a circumferential pattern of N-S alternating poles on the roller 52. The means 50 further includes means such as a motor M for rotatably driving the roller 52 so as to cause the magnets M1, M2, M3 . . . , and hence the magnetic fields created by their alternating N-S poles, to move changedly and proximately past the backside of the image-bearing member 11 at a point Y. As explained above, the point Y is upstream of the point X relative to the movement of the image-bearing member 11.

In order to further insure that the image-bearing member 11 is not disturbed, it is preferable that the rotating magnetic roller 52 be mounted out of contact with the backside of the member 11 at the point Y. As shown, the roller 52 however needs to be spaced only a small clearance distance from the backside of the number 11. This spacing is small so as to ensure that the member 11, including its frontside surface 12 and the particles thereon, fall within a region of strong influence of the magnetic fields of the magnets M1, M2, M3 . . .

Figure 2:
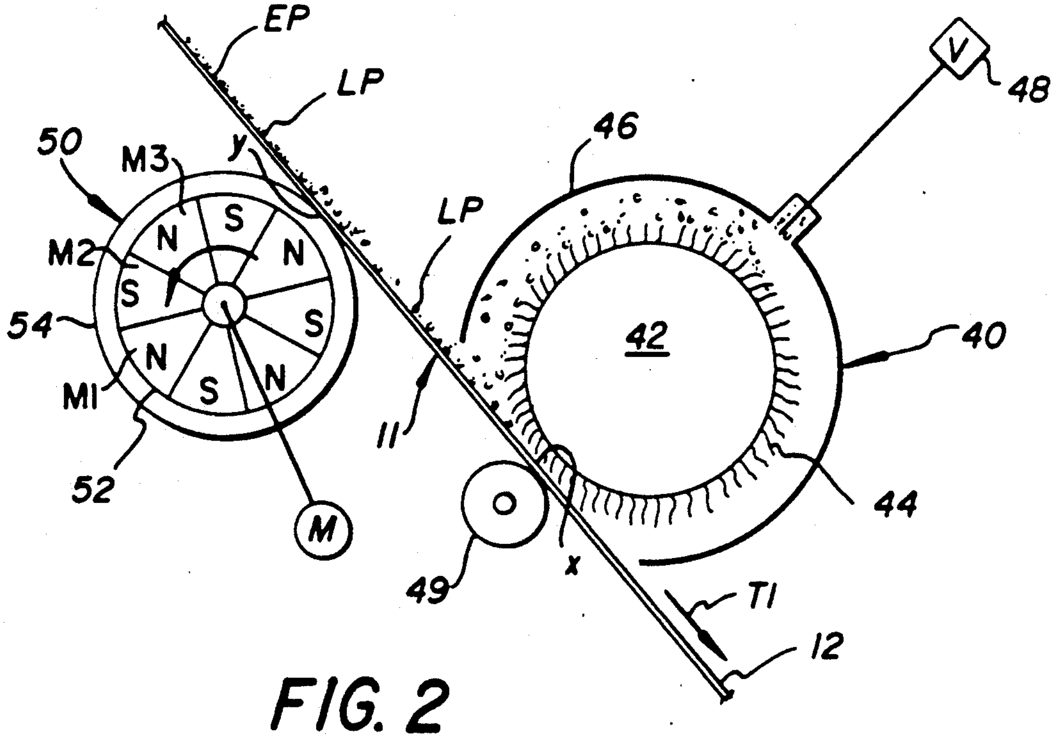
FIG. 2 is an enlarged schematic showing the cleaning means, and the carrier loosening device of FIG. 1.

As further shown in FIG. 2, the means 50 however may also include a stationary, non-magnetic sleeve 54 which encloses, but is spaced a small distance from, the periphery of the magnetic roller 52. As such, the means 50 can be mounted at the point Y such that the stationary sleeve 54 contacts and thus spaces the backside of the image-bearing member 11 from the rotating roller 52. Given such contact, the sleeve 54 may also be free to rotate when frictionally driven by the movement of the contacting member 11. Such frictional movement is of course less likely (than the driven roller 52) to introduce undesirable disturbances in the member 11.

At the point Y, embedded particles EP come under the influence of the fast changing N and S polarity magnetic fields of the means 50. These particles EP as should be expected, are randomly embedded in the surface 12 with either a N-pole or a S-pole fully or partially embedded in, and hence closer to, the means 50. Because of the free and open space over the particles EP on the front side 12 of the member 11, each particle EP will, on the one hand, be caused by a sufficient repelling magnetic force induced by a like magnetic pole of the roller 52, to move away from its closeness to the roller 52, and thus to be disembedded from the surface 12. Meantime, similarly oriented, but loose, particles LP under the same repelling influence will be caused to jump from such surface 12, before falling back thereon due to gravity or to magnetic re-attraction by an opposite magnetic pole of the roller 52. On the other hand, at the point Y, any initial attraction of an embedded particle EP by an opposite pole of the roller 52 will merely serve to loosen such particles as embedded, and will be quickly replaced by a desirable repulsion of the same particle, as above, by the very next pole of the magnetic roller 52—which will be a like pole.

The effectiveness of the means 50 as such will depend significantly on the magnetic strengths of the magents M1, M2, M3 . . . , of the roller 52 relative to the magnetic strengths of the embedded magnetic particles EP. Such effectiveness will also depend on the rotational speed (rpm) of the roller 52. These parameters therefore should be optimized and selected so as to effect maximum removal of embedded particles EP from the surface 12.

Although, as to be expected, reattraction of disembedded particles occurs at the point Y, it has been found that the fast changing and moving nature of the alternated magnetic poles of the roller 52 causes the disembedded particles not only to be repelled, but also to move about on the surface 12. Such movement prevents each particle from re-entry into a depression from which it was freed by repulsion from the surface 12. Additionally, the forces of re-attraction are believed not to be sufficient to cause significant re-embedding (if any) of such particles into the surface 12. Therefore, disembedded particles will remain as loose particles LP on such surface 12 for effective conventional removal therefrom by the cleaning apparatus 40.

Although the invention has been described with particular reference to a preferred embodiment, it is understood that modifications and variations thereto can be effected within the spirit and scope of the invention thereof.

What is claimed is:

1. A mechanism for removing residual toner and magnetic carrier particles from the frontside image bearing surface of a moving image bearing member in an electrostatographic copier or printer, the mechanism including:

(a) cleaning means for removing toner and loose magnetic carrier particles from such surface;

(b) a magnetic carrier loosening means for disembedding or loosening magnetic carrier particles embedded in such image bearing surface, said carrier particle loosening means consisting of a magnetic device, said magnetic device generating fast changing magnetic fields for magnetically repelling and attracting the magnetic carrier particles, thereby disembedding and loosening such carrier particles from such surface, said magnetic field generating means being mounted spaced a small distance from the backside of said image-bearing member, and said carrier loosening means being located relative to said cleaning means so as to disembed or loosen such embedded particles in time for effective removal by said cleaning means.

2. The apparatus of claim 1 wherein said magnetic field generating means includes:

(a) A magnetic roller comprising a plurality of longitudinally extending magnets, said magnets forming a circumferential pattern of N-S alternating poles thereto; and (b) means for rotatably driving said magnetic roller so as to generate fast changing magnetic fields behind said image-bearing member.

3. The apparatus of claim 2 wherein said magnetic field generating means further includes a stationary non-magnetic sleeve enclosing said magnetic roller.

4. The apparatus of claim 3 wherein said magnetic field generating means is mounted such that said stationary non-magnetic sleeve contacts said backside of said image-bearing member.

5. An electrostatographic reproduction apparatus including an image-bearing member having a frontside image-bearing surface, means for electrostatically forming a latent image on said image-bearing surface, means for developing such latent image with developer material comprising toner and magnetic carrier particles, means for transferring the developed image onto a suitable receiver for fusing, and cleaning means for removing loose residual particles from said image-bearing surface, the improvement comprising means generating fast changing magnetic fields about said image-bearing member for disembedding and loosening magnetic carrier particles strongly attached to or embedded in said image-bearing surface, said magnetic field generating means being located to the backside of said image-bearing member, after said image transfer means, but before said cleaning means.

6. The reproduction apparatus of claim 5 wherein said frontside image bearing surface is soft.

7. The reproduction apparatus of claim 5 wherein said magnetic carrier particles of said developer material consist of small, hard ferrite magnets.

* * * * *